United States Patent [19]
Anda et al.

[11] Patent Number: 6,051,454
[45] Date of Patent: Apr. 18, 2000

[54] SEMICONDUCTOR DEVICE AND METHOD FOR FABRICATING THE SAME

[75] Inventors: Yoshiharu Anda, Osaka; Toshinobu Matsuno, Kyoto; Manabu Yanagihara; Mitsuru Tanabe, both of Osaka; Toshiaki Matsui; Nobumitsu Hirose, both of Tokyo, all of Japan

[73] Assignees: Matsushita Electric Industrial Co., Ltd., Osaka; Communications Research Laboratory, Ministry of Posts and Telecommunications, Tokyo, both of Japan

[21] Appl. No.: 09/151,357

[22] Filed: Sep. 10, 1998

[30] Foreign Application Priority Data

Sep. 11, 1997  [JP]  Japan .................................. 9-246840

[51] Int. Cl.⁷ ............................................... H01L 21/338
[52] U.S. Cl. ......................... 438/167; 438/182; 438/574; 438/950
[58] Field of Search ...................... 438/167, 182, 438/574, 579, 640, 671, 673, 949, 951, FOR 133, 950; 430/312, 313

[56] References Cited

U.S. PATENT DOCUMENTS

| | | | |
|---|---|---|---|
| 5,304,511 | 4/1994 | Sakai ........................................ | 438/951 |
| 5,334,542 | 8/1994 | Saito et al. ............................. | 438/579 |
| 5,583,063 | 12/1996 | Samoto ................................... | 438/951 |
| 5,665,518 | 9/1997 | Maeda et al. ......................... | 430/270.1 |
| 5,738,975 | 4/1998 | Nakano et al. ....................... | 430/280.1 |

FOREIGN PATENT DOCUMENTS

| | | | |
|---|---|---|---|
| 355095324 | 7/1980 | Japan ............................. | 438/FOR 133 |
| 04329644 | 11/1992 | Japan . | |
| 08203926 | 8/1996 | Japan . | |
| 09293736 | 11/1997 | Japan . | |
| 10004102 | 1/1998 | Japan . | |

OTHER PUBLICATIONS

S. Wolf et al., Silicon Processing for VLSI Era V.1, Lattice Press: CA, p. 429–430, Dec. 1986.

*Primary Examiner*—Carl Whitehead, Jr.
*Assistant Examiner*—Jeff Vockrodt
*Attorney, Agent, or Firm*—McDermott, Will & Emery

[57] ABSTRACT

A lower resist film, which is made of PMMA for EB exposure and has a thickness of about 200 nm, is applied onto a substrate, and then an upper resist film to be exposed to i-rays is applied on the lower resist film. Thereafter, a mixed layer, in which the upper and lower resist films are mixed, is formed in the interface between the upper and lower resist films. Next, the upper resist film, except for the head-forming region thereof, is exposed to i-rays and developed, thereby forming an upper-layer opening. And then the mixed layer and a leg-forming region of the lower resist film are exposed to EB and developed, thereby forming a lower-layer opening having an upper part like a taper progressively expanding upward.

6 Claims, 10 Drawing Sheets

SEMICONDUCTOR DEVICE AND METHOD FOR FABRICATING THE SAME

BACKGROUND OF THE INVENTION

The present invention relates to a T-gate electrode of a field effect transistor (an FET having a very small gate length from about 0.1 µm to about 0.2 µm, in particular) in a semiconductor device, and a method for fabricating the same.

In recent years, telecommunications technologies utilizing wireless communication have been tremendously developed and are still the object of vigorous research. Among other things, the application of high frequencies of 30 GHz or more on the millimeter wave bands to wireless LAN's, radar systems for preventing car crashes and the like is strongly demanded, because the frequency region has very abundant frequency resources yet to be cultivated.

In order to realize a super-high-frequency device operating in the millimeter wave band, the gate length of an FET should be shortened. Specifically, technology for forming a gate with a length from about 0.1 µm to about 0.2 µm is indispensable. Currently, such a gate is generally formed through electron beam (EB) exposure techniques. However, as the gate length is shortened, the resistance of the gate is increased correspondingly, which constitutes one factor of the decrease in gain and the deterioration of noise resistance characteristics in the high frequency bands. As a means for shortening the gate length and reducing the gate resistance at the same time, a so-called "T-gate structure" or "mushroom gate structure" is effectively used. The "T-gate" has a structure in which the lower portion in contact with a substrate is formed to have a much smaller size or cross-sectional area than that of the upper portion. The gate in such a shape is often used in high-frequency FETs.

(Prior Art Example 1)

Hereinafter, a conventional method for fabricating a semiconductor device having a T-gate electrode will be described with reference to the drawings. In this specification, the upper portion of a T-gate electrode, which is formed to have a relatively large size in order to reduce the resistance, will be called a "head portion". On the other hand, the lower portion thereof, which extends downward from the head portion and is formed to have a relatively small size in order to shorten the gate length, will be called a "leg portion".

FIGS. 8(a) through 8(d) and FIGS. 9(a) through 9(c) illustrate cross-sectional structures respectively corresponding to conventional process steps for forming a T-gate electrode through EB exposure technique using a multi-layer resist. In this example, a multi-layer resist, consisting of two layers of polymethyl methacrylate (PMMA) with respectively different sensitivities and being widely used as an EB resist, is employed.

First, as shown in FIG. 8(a), a lower resist film 102, made of PMMA having a high molecular weight and low sensitivity is applied onto a semiconductor substrate 101. Next, an upper resist film 103 made of PMMA having a low molecular weight and high sensitivity is applied thereon. Then, as shown in FIG. 8(b), a region 103a of the upper resist film 103, where the head portion of the gate electrode is to be formed (in this specification, such a region will be called a "head-forming region"), is subjected to the first EB exposure. And, as shown in FIG. 8(c), the upper resist film 103 is developed, thereby removing a part of the upper resist film 103 corresponding to the head-forming region 103a to form an opening 103b.

Next, as shown in FIG. 8(d), a region 102a of the lower resist film 102 where the leg portion of the gate electrode is to be formed (similarly, such a region will be called a "leg-forming region") is subjected to the second EB exposure. Then, as shown in FIG. 9(a), the lower resist film 102 is developed, thereby removing a part of the lower resist film 102 corresponding to the leg-forming region 102a to form an opening 102b. In this manner, a resist pattern for forming a T-gate electrode is obtained in the opening 103b of the upper resist film 103 and the opening 102b of the lower resist film 102.

Subsequently, as shown in FIG. 9(b), a metal film 104A is evaporated and deposited over the entire surface of the semiconductor substrate 101. And then the upper and lower resist films 103, 102 are lifted off, thereby making a T-gate electrode 104B out of the metal film 104A.

As described above, this structure uses the lower resist 102, made of PMMA having a high molecular weight, low sensitivity and high resolution, as the first layer and the upper resist 103, made of PMMA having a low molecular weight and high sensitivity, as the second layer. Thus, the T-gate electrode 104B can have a leg portion of the size on the order of sub-quarter microns and a head portion of a relatively large size, while suppressing the influence of the exposure radiation for the upper resist film 103 on the lower resist film 102.

In the first prior art example, the EB exposure needs to be performed twice. A method for forming a T-gate pattern by performing the EB exposure only once has also been proposed.

In addition, in another example, not the two-layered resist but a three-layered resist, in which an overhang can be formed easily, is used for further facilitating lifting off.

(Prior Art Example 2)

Hereinafter, another conventional method for fabricating a semiconductor device having a T-gate electrode will be described with reference to the drawings.

FIGS. 10(a) through 10(d) illustrate cross-sectional structures respectively corresponding to conventional process steps for forming a T-gate electrode through EB exposure technique using a single-layer resist. First, as shown in FIG. 10(a), an insulating film 106, made of $SiO_2$, SiN or the like, is deposited over the entire surface of a semiconductor substrate 105. Then, a first resist film 107, made of PMMA, for example, is applied as a resist for EB exposure onto the insulating film 106. Thereafter, the upper surface of the gate-electrode-leg-forming region of the first resist film 107 is exposed to EB and then the first resist film 107 is developed. In this manner, part of the first resist film 107 corresponding to the leg-forming region is removed, thereby forming an opening 107a.

Next, the insulating film 106 is dry-etched using a gas such as $CF_4$ gas and the first resist film 107 as a mask, thereby forming an opening 106a in the leg-forming region of the insulating film 106 as shown in FIG. 10(b). Thereafter, the first resist film 107 is removed, and a second resist film 108, which is sensitive to i-rays of ultraviolet light, is applied onto the entire surface of the semiconductor substrate 105 as shown in FIG. 10(c). Then, a gate-electrode-head-forming region of the second resist film 108 is patterned with i-rays and developed in a predetermined manner, thereby forming an opening 108a. In this way, a pattern for forming a T-gate electrode is obtained in the opening 108a of the second resist film 108 and the opening 106a of the insulating film 106.

Next, as shown in FIG. 10(d), a metal film is evaporated and deposited over the entire surface of the semiconductor substrate 105, and the second resist film 108 is lifted off, thereby making a T-gate electrode 109 out of the metal film.

However, the above-described conventional methods for forming a T-gate electrode have various problems to be described below.

First, in the first prior art example, the upper and lower resist films 103 and 102 are both subjected to EB exposure. Thus, during the first exposure for the upper resist film 103, the upper part of the lower resist film 102, which is in contact with the upper resist film 103, is also exposed to radiation to a small degree. As a result, the opening 102b of the lower resist film 102 is formed like a taper progressively expanding upward. Thus, the head and leg portions of the T-gate electrode 104 can be satisfactorily connected to each other. However, since the EB exposure needs to be performed twice, a currently available EB exposure system would have the throughput considerably decreased. In addition, the lower resist film 102 is unintentionally exposed to radiation partially during the exposure and development of the upper resist film 103, and the thickness of the lower resist film 102 is adversely decreased during the development. Thus, various controls should be performed to suppress these undesired phenomena.

Moreover, if the upper and lower resist films are simultaneously exposed to radiation during a single exposure process step, then the lower resist film is exposed through the upper resist film. Thus, in order to obtain an optimum T-structure, exposure patterns and development conditions should be determined so as to simultaneously obtain desired pattern shapes and sizes for the upper and lower resist films. Since such optimization is hard to realize, it is difficult to stably form a gate electrode in a desired T-shape.

On the other hand, in the second prior art example using a single-layer resist for EB exposure, the problems of the fabrication process using the two-layered resist film consisting of the upper and lower layers can be avoided. Thus, the second example is more advantageous in terms of the process throughput and the stability of the T-electrode. However, the opening 106a of the insulating film 106 for forming the leg portion and supporting the head portion has inner walls substantially vertical to the surface of the substrate 105. Thus, in filling in the openings 106a and 108a with the metal film for forming the gate electrode, the upper end of the opening 106a is more likely to be completely filled in with the metal film before the leg portion, being formed through the deposition of the metal film over the bottom of the opening 106a, reaches the upper end to be connected to the head portion being formed through the deposition of the metal film over the upper surface of the insulating film 106. Accordingly, such a process has a problem in that the head and leg portions of the T-gate electrode 109 cannot be connected to each other satisfactorily. In accordance with this process, it is difficult to form a T-gate electrode 109 having a gate length of about 0.1 μm. In addition, the gate resistance is increased. Moreover, since the leg portion of the T-gate electrode is formed by filling in the opening 106a of the insulating film 106 with the metal film for forming the gate electrode, the gate capacitance adversely increases. This is because the insulating film 106 having a larger dielectric constant than that of the air exists around the leg portion of the T-gate electrode 109.

As described above, in the fabrication process using a multi-layer EB resist according to the first prior art example, though the leg portion of the T-gate electrode can be advantageously formed like a taper progressively expanding upward, the throughput and the stability of the T-gate electrode are adversely low. On the other hand, in the fabrication process using a single-layer EB resist according to the second prior art example, though the throughput is satisfactory, the leg portion of the T-gate electrode cannot be formed in a completely satisfactory taper shape, and the gate resistance and capacitance are both increased. That is to say, the first and second prior art examples have a "trade-off" relationship.

SUMMARY OF THE INVENTION

An object of the present invention is accomplishing high throughput and high stability during the fabrication of a T-gate electrode including a head portion and a leg portion extending downward from the head portion. Another object of the present invention is forming the upper part of the leg portion, which is connected to the head portion, in a desired taper shape progressively expanding upward, i.e., having a diameter gradually increasing upward.

In order to accomplish these objects, according to the present invention, a lower resist film sensitive to electron beams and an upper resist film sensitive to ultraviolet rays are sequentially applied onto a semiconductor substrate. Thereafter, the upper resist film is exposed to ultraviolet rays and patterned, thereby forming an upper-layer opening. And then an upper surface region of the lower resist film, which is exposed inside the upper-layer opening, is exposed to electron beams and patterned, thereby forming a lower-layer opening.

The semiconductor device of the present invention includes a T-gate electrode, which is formed over a semiconductor substrate and includes a head portion and a leg portion extending downward from the head portion. The T-gate electrode is formed in such a shape that an upper part of the leg portion, which part is connected to the head portion, has a cross-sectional area gradually increasing toward the head portion when the cross section is taken in parallel to a surface of the substrate.

In the semiconductor device of the present invention, the T-gate electrode is formed in such a shape that an upper part of the leg portion, connected to the head portion, has a cross-sectional area gradually increasing toward the head portion when the cross section is taken in parallel to a surface of the substrate. Thus, the upper part of the leg portion of the T-gate electrode, connected to the head portion, is formed like a taper progressively expanding upward, i.e., having a diameter gradually increasing upward. Accordingly, since the head and leg portions can be satisfactorily connected to each other mechanically and electrically, reduction of the gate resistance and shortening of the gate length are realized at the same time. As a result, the semiconductor device of the invention can operate stably even in high frequency bands.

The method of the present invention is a method for fabricating a semiconductor device including a T-gate electrode, which is formed over a semiconductor substrate and includes a head portion and a leg portion extending downward from the head portion. The method includes the steps of: a) applying a lower resist film, sensitive to electron beams, on the semiconductor substrate; b) applying an upper resist film, sensitive to ultraviolet rays, on the lower resist film; c) patterning a region of the upper resist film, in which region the head portion is to be formed, by irradiating the upper resist film with ultraviolet rays, and then forming an upper-layer opening in the head-forming region of the upper resist film by developing the upper resist film patterned; d) patterning a region of the lower resist film, in which region the leg portion is to be formed, by irradiating an upper surface region of the lower resist film with electron beams, the upper surface region being exposed inside the upper-layer opening, and then forming a lower-layer opening in the leg-forming region of the lower resist film by developing the lower resist film patterned, an upper part of the lower-layer opening being connected to the head-forming region and having a diameter gradually increasing toward the head-forming region; and e) forming a T-gate electrode of a conductor film by filling in the lower- and upper-layer openings with the conductor film over the semiconductor substrate.

In accordance with the method of the present invention, a lower resist film sensitive to electron beams and an upper resist film sensitive to ultraviolet rays are sequentially applied onto a semiconductor substrate. Thereafter, the upper resist film is irradiated with ultraviolet rays, thereby patterning a gate-electrode-head-forming region of the upper resist film. Then, the upper resist film patterned is developed, thereby forming an upper-layer opening in the head-forming region of the upper resist film. Subsequently, an upper surface region of the lower resist film, which is exposed inside the upper-layer opening, is irradiated with electron beams, thereby patterning a gate-electrode-leg-forming region of the lower resist film. Then, the lower resist film patterned is developed, thereby forming a lower-layer opening in the leg-forming region of the lower resist film such that the upper part of the lower-layer opening, connected to the head portion, has a diameter gradually increasing toward the head-forming region. Since only the lower resist film is exposed to electron beams, the throughput does not decrease so much. In addition, it is no longer necessary to perform a control for preventing the film thickness from being decreased, which control is required when a plurality of resist films to be exposed to electron beams are deposited. Moreover, since the upper part of the lower-layer opening as the leg-forming region, which is connected to the head portion, is formed in such a shape as having a diameter gradually increasing toward the head-forming region. Thus, the leg portion of the T-gate electrode has an upper part like a taper progressively expanding upward, i.e., having a diameter gradually increasing upward. Accordingly, since the head and leg portions can be satisfactorily connected to each other mechanically and electrically, reduction of the gate resistance and shortening of the gate length are realized simultaneously. As a result, a semiconductor device operating stably even in high frequency regions can be provided while maintaining a high throughput.

In one embodiment of the present invention, the step c) preferably includes the step of forming a mixed layer in an interface between the lower and upper resist films, the mixed layer being formed through the mixture of the lower and upper resist films.

In such an embodiment, if the mixed layer is exposed to EB, then an opening is formed like a taper progressively expanding upward as a result of the exposure. Thus, the leg portion of the T-gate electrode can have a tapering upper part with more certainty.

In another embodiment of the present invention, the upper resist film is preferably made of a chemically amplified resist.

In such an embodiment, the lower-layer opening to be the gate-electrode-leg-forming region does not fail to have an upper part connected to the head-forming region and shaped like a taper progressively expanding upward, i.e., having a diameter gradually increasing toward the head-forming region.

In still another embodiment of the present invention, the lower resist film is preferably made of a resist containing polymethyl methacrylate, and the upper resist film is preferably made of a resist containing propyleneglycolmonomethylether acetate.

In such an embodiment, it is also highly probable that the lower-layer opening has an upper part like a taper progressively expanding upward.

In still another embodiment, the method of the present invention preferably further includes the step of baking the upper resist film between the steps c) and d).

In such an embodiment, the upper resist film, including the upper-layer opening, is less likely to dissolve in a developer for the lower resist film. Thus, the head portion of the T-gate electrode can be formed more accurately.

In still another embodiment of the present invention, the step d) preferably includes the step of removing residues of the lower and upper resist films by dry-etching the lower and upper resist films.

In such an embodiment, a recessed portion of the semiconductor substrate can be formed with more precision through recess etching. Thus, it is possible to prevent the Schottky contact between the recessed portion of the semiconductor substrate and the leg portion of the gate electrode from being deteriorated.

In still another embodiment of the present invention, the step a) preferably includes the step of depositing an adhesion layer, made of an insulating material, over the semiconductor substrate prior to the application of the lower resist film.

In such an embodiment, even if the lower resist film is a resist for EB exposure having a lower degree of adhesion with the surface of the semiconductor substrate, the lower resist film can be adhered to the surface of the substrate more satisfactorily. Thus, in the case of forming a recessed portion through wet etching, the adhesion layer can prevent the recess etchant from permeating the regions under source/drain electrodes. As a result, it is possible to prevent the recess etchant from adversely affecting the electrical characteristics of the semiconductor device.

DETAILED DESCRIPTION OF THE INVENTION

The present inventors conducted intensive research and development on a method for forming a T-gate electrode including a connection portion in a desired shape between the head and leg portions thereof, while trying to increase the throughput. That is to say, we fully looked into a method for forming the leg portion with an upper part like a taper progressively expanding upward, i.e., having a cross-sectional area gradually increasing toward the head portion. As a result, we reached the following conclusion.

Specifically, a lower resist film to be exposed to EB and an upper resist film to be exposed to i-rays are sequentially applied onto a semiconductor substrate. Then, the upper resist film is exposed to i-rays, thereby forming an upper-layer opening. Thereafter, an upper surface region of the lower resist film, which is exposed inside the upper-layer opening, is exposed to EB, thereby forming a lower-layer opening. In this case, if some kind of lower resist film for EB exposure and some kind of upper resist film for i-ray exposure are combined, a mixed layer is formed through the mixture of the upper and lower resist films in the lower part of the upper resist film. And if the mixed layer is exposed to EB, then a tapering opening is formed in the mixed layer so as to progressively expand upward. Thus, by filling in the upper- and lower-layer openings with a conductor film for forming a gate electrode, the upper part of the leg portion, which is connected to the head portion, can be formed like a taper having a cross-sectional area increasing upward with more ease and more certainty.

EMBODIMENT 1

Hereinafter, the first embodiment of the present invention will be described with reference to the drawings.

Figure 1:
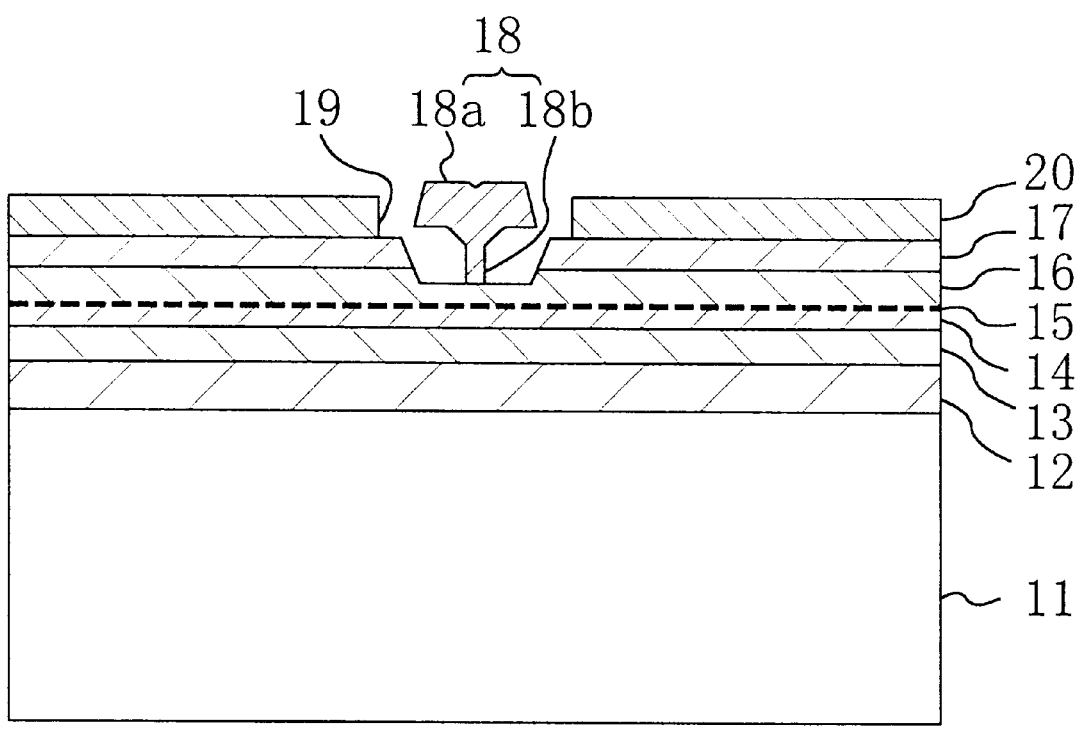
FIG. 1 is a cross-sectional view illustrating the structure of a semiconductor device in the first embodiment of the present invention.

FIG. 1 illustrates a cross-sectional structure of a semiconductor device in the first embodiment of the present invention. The semiconductor device shown in FIG. 1 is a heterojunction type field effect transistor including a T-gate electrode of a size on the order of sub-quarter microns. On a substrate 11 made of semi-insulating GaAs, a buffer layer 12, which is made of undoped GaAs, has a thickness of 1 $\mu$m, and alleviates lattice mismatch between the substrate 11 and epitaxial layers grown on the substrate 11; a channel layer 13, which is made of undoped $In_{0.2}Ga_{0.8}As$ and has a thickness of 10 nm and where carriers travel; a barrier layer 14, which is made of undoped $Al_{0.25}Ga_{0.75}As$ and has a thickness of 3 nm; a carrier supply layer 15, only one atomic layer of which is planar-doped with Si as n-type impurity ions at a dose of $5.0\times10^{12}$ cm$^{-2}$; a Schottky layer 16, which is made of undoped $Al_{0.25}Ga_{0.75}As$, has a thickness of 30 nm, and is in Schottky contact with the gate electrode; and a cap layer 17, which is made of n-type GaAs, has a thickness of 50 nm and in ohmic contact with the source/drain regions are sequentially epitaxially grown.

On the recessed portion of the Schottky layer 16, a T-gate electrode 18, which is formed by stacking Ti/Pt/Au films (50 nm/50 nm/400 nm) and includes a head portion 18a and a leg portion 18b extending downward from the head portion 18a, is formed. The leg portion 18b of the T-gate electrode 18 is formed such that the upper part of the leg portion 18b, connected to the head portion 18a, has a cross-sectional area gradually increasing upward when the cross section is taken in parallel to the surface of the substrate 11. The T-gate electrode 18 may also be a stack of Al/Ti films.

Over the cap layer 17, source/drain electrodes 19 and 20, each made of a metal film containing Au or the like, are formed in the gate longitudinal direction of the T-gate electrode 18.

In this embodiment, the T-gate electrode 18, including the head portion 18a and the leg portion 18b extending downward therefrom, is formed such that the upper part of the leg portion 18b, connected to the head portion 18a, has a cross-sectional area gradually increasing toward the head portion 18a when the cross section is taken in parallel to the surface of the substrate 11. Thus, the upper part of the leg portion 18b, connected to the head portion 18a, is formed like a taper progressively expanding upward, and therefore, the head portion 18a and the leg portion 18b can be satisfactorily connected to each other mechanically and electrically. As a result, the gate length can be shortened stably, and a field effect transistor with reduced resistance and excellent high frequency characteristics is realized.

Hereinafter, a method for fabricating a semiconductor device having the above-described structure will be described with reference to the drawings.

Figure 2A:
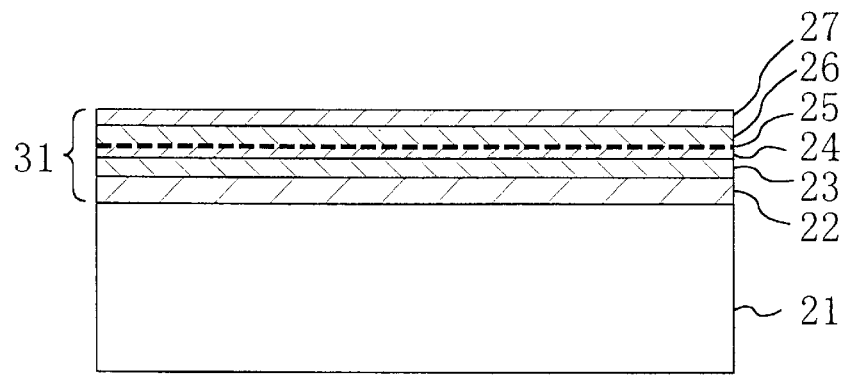
FIGS. 2(a) through 2(c) are cross-sectional views sequentially illustrating the process steps for fabricating the semiconductor device of the first embodiment.

FIG. 2(a) through FIG. 4(d) illustrate the cross-sectional structures corresponding to the respective process steps for forming a T-gate electrode in the method for fabricating a semiconductor device in the first embodiment. As an epitaxial substrate, a substrate 21, which is made of semi-insulating GaAs and has an epitaxial multilayer 31 formed on the principal surface thereof, is used as shown in FIG. 2(a). The epitaxial multilayer 31 includes: a buffer layer 22, which is made of undoped GaAs and has a thickness of 1 $\mu$m; a channel layer 23, which is made of undoped $In_{0.2}Ga_{0.8}As$ and has a thickness of 10 nm; a barrier layer 24, which is made of undoped $Al_{0.25}Ga_{0.75}As$ and has a thickness of 3 nm; a carrier supply layer 25, only one atomic layer of which is planar-doped with Si as n-type impurity ions at a dose of $5.0\times10^{12}$ cm$^{-2}$; a Schottky layer 26, which is made of undoped cm$^{-2}$; a Schottky layer 26, which is made of undoped $Al_{0.25}Ga_{0.75}As$ and has a thickness of 30 nm; and a cap layer 27, which is made of n-type GaAs and has a thickness of 50 nm, all of these layers having been sequentially stacked over the substrate 21 and formed through epitaxial growth.

Figure 2B:
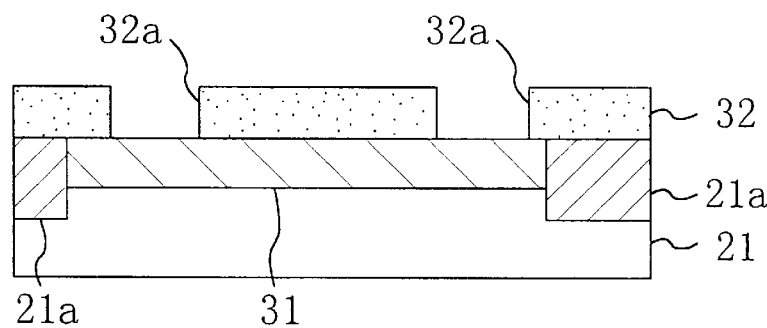
Figure 2C:
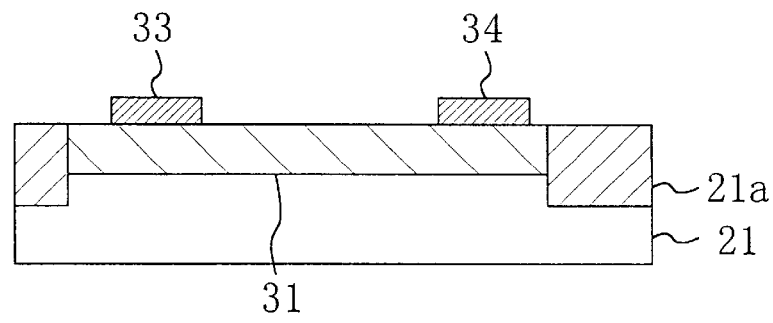

Next, as shown in FIG. 2(b), boron or oxygen ions are implanted into element isolation regions 21a in the substrate 21, thereby isolating respective elements. In this step, the elements may be isolated from each other by removing the element isolation regions 21a through mesa etching. Thereafter, a resist pattern 32 having openings 32a in the source/drain forming regions is formed over the epitaxial multilayer 31. Then, a metal film containing Au, for example, is evaporated and deposited over the entire surface of the substrate 21. And the resist pattern 32 is lifted off, thereby making source/drain electrodes 33, 34 out of the metal film on the epitaxial multilayer 31 over the substrate 21 so as to be spaced from each other. It is noted that in all the drawings referred to below (i.e., FIG. 2(b) through FIG. 7(d)), the detailed semiconductor layers included in the epitaxial multilayer 31 on the substrate 21 will not be illustrated.

Figure 3A:
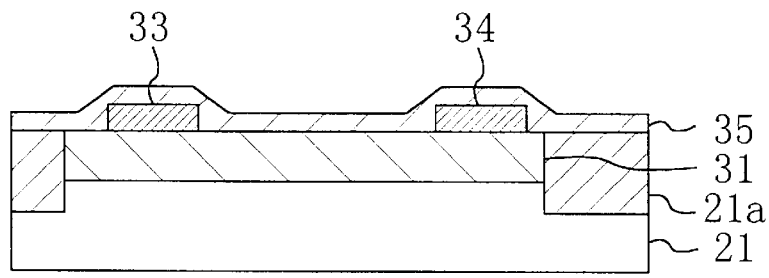
FIGS. 3(a) through 3(d) are cross-sectional views illustrating the subsequent process steps for fabricating the semiconductor device of the first embodiment.

Then, as shown in FIG. 3(a), a lower resist film 35, made of PMMA and to be exposed to EB, is applied onto the entire surface of the substrate 21 and is baked in a predetermined manner. The thickness of the lower resist film 35 regulates the height of the leg portion of the T-gate electrode, and considerably affects the operating characteristics of the transistor in the high frequency regions. This is because if the height of the leg portion is increased, the parasitic capacitance among the gate electrode, the substrate and the ohmic electrode is decreased. However, if the lower resist film 35 is too thick, then the aspect ratio of the height to the gate length becomes too large. In such a case, since the leg and head portions of the T-gate electrode can not be satisfactorily connected to each other, the gate resistance increases. Thus, in this embodiment, the thickness of the lower resist film 35 is set in the range from about 200 nm to about 250 nm.

Figure 3B:
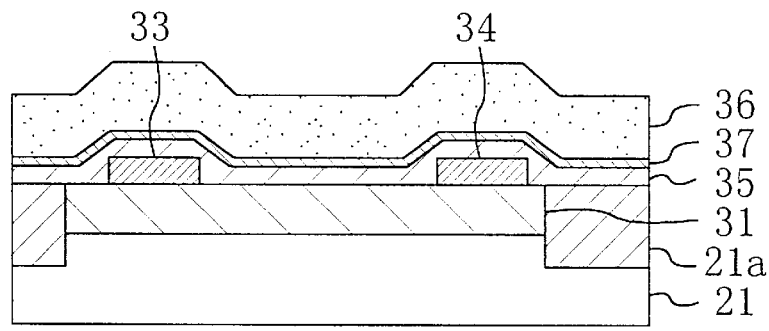

Subsequently, as shown in FIG. 3(b), an upper resist film 36 sensitive to i-rays, which are ultraviolet rays having a wavelength of 365 nm, is applied onto the entire surface of the substrate 21. In this embodiment, the upper resist film 36 is made of a negative type resist TLOR-N001 (name of a product manufactured by Tokyo Ohka Kogyo Co., Ltd.; hereinafter, simply referred to as "TLOR") mainly composed of propyleneglycolmonomethylether acetate (PGMEA). The thickness of the upper resist film 36 regulates the height of the head portion of the T-gate electrode. In general, in order to reduce gate resistance, a metal film for forming a gate electrode should have a thickness of 500 nm or more. Thus, in this embodiment, the thickness of the upper resist film 36 is set in the range from about 0.5 µm to about 1.5 µm. The TLOR film is a chemically amplified resist. Accordingly, after the application thereof, the resist should be sequentially subjected to pre-baking, exposure, post exposure baking (PEB) and development. Consequently, as shown in FIG. 3(b), a mixed layer 37 is formed in the lower part of the upper resist film 36, closer to the lower resist film 35, through the mixture of the upper and lower resist films 36, 35 during any of these treatments after the upper resist film 36 has been applied.

Figure 3C:
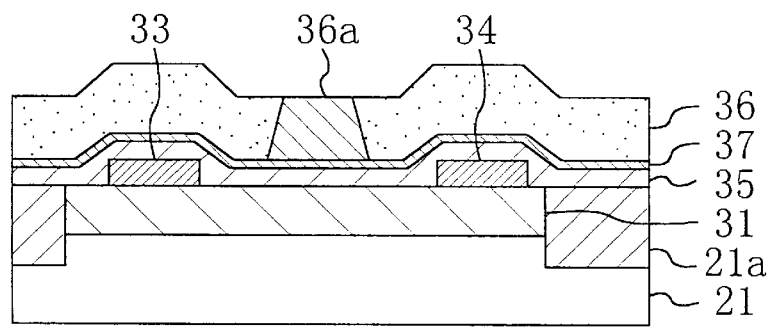

Next, as shown in FIG. 3(c), the upper resist film 36 is pre-baked in a predetermined manner. Then, the upper resist film 36, except for the gate-electrode-head-forming region 36a, is exposed to i-rays by using a stepper. Subsequently, PEB baking is performed, thereby developing the upper resist film 36 with a tetramethylammonium hydroxide (TMAH) solution, which is a developer for the upper resist film 36. In this case, the lower resist film 35 and the mixed layer 37 are not dissolved by the TMAH solution.

Figure 3D:
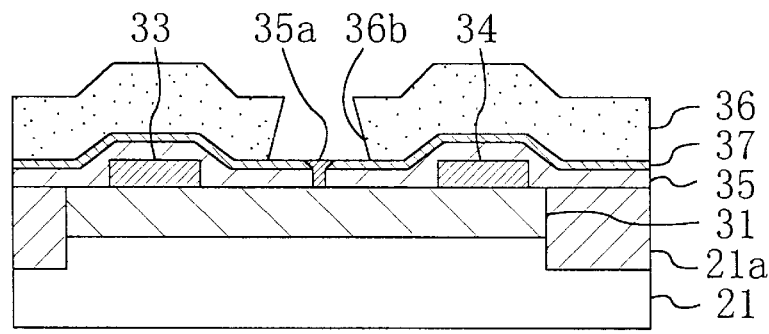

Consequently, as shown in FIG. 3(d), a part of the upper resist film 36 corresponding to the head-forming region 36a is removed to form an upper-layer opening 36b. Then, the upper resist film 36 is baked to make the upper resist film 36 hard to dissolve in a developer for the lower resist film 35 as will be described later. Thereafter, a T-gate-electrode-leg-forming region 35a of the mixed layer 37 and the lower resist film 35 is exposed to EB by using an EB exposure system.

Figure 4A:
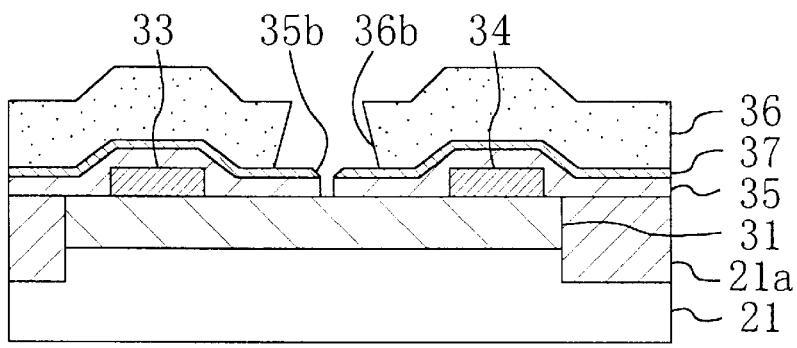
FIGS. 4(a) through 4(d) are cross-sectional views illustrating the remaining process steps for fabricating the semiconductor device of the first embodiment.

Next, as shown in FIG. 4(a), the lower resist film 35 is developed with a mixture of methylisobutyl ketone (MIBK) and isopropanol (IPA), which is a developer for the lower resist film 35. As a result, part of the lower resist film 35 corresponding to the leg-forming region 35a is removed to form a lower-layer opening 35b. In general, a lower resist film is developed to form an inverse taper progressively expanding downward. By contrast, in this embodiment, the mixed layer 37 is formed in the interface between the lower and upper resist films 35, 36. Thus, the lower resist film 35 is developed to form a lower-layer opening 35b with the upper part in the mixed layer 37 shaped like a taper progressively expanding upward.

Thereafter, the lower-layer opening 35b of the lower resist film 35 is dry-etched with $O_2$ plasma, thereby removing resist residues (presumably those of the mixed layer 37). As a result, since the recess etching can be performed more accurately in the next process step, it is possible to prevent the Schottky contact from being deteriorated. In this case, the lower resist film 35 made of PMMA is less resistant to dry etching than a positive resist generally used. Thus, the pattern size possibly expands or the head portion of the T-gate electrode possibly comes closer to the surface of the substrate as a result of the decrease in thickness of the lower resist film 35. Accordingly, the conditions for dry etching should be sufficiently optimized.

Figure 4B:
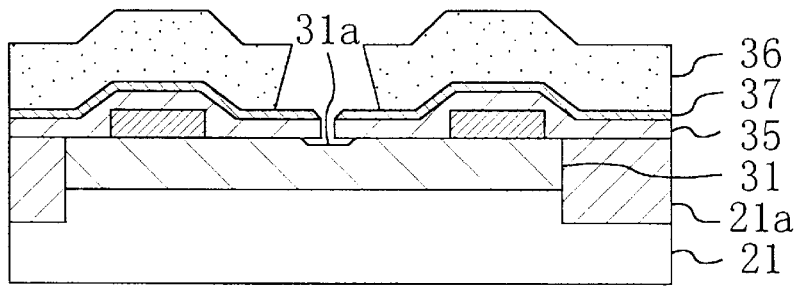
Figure 4C:
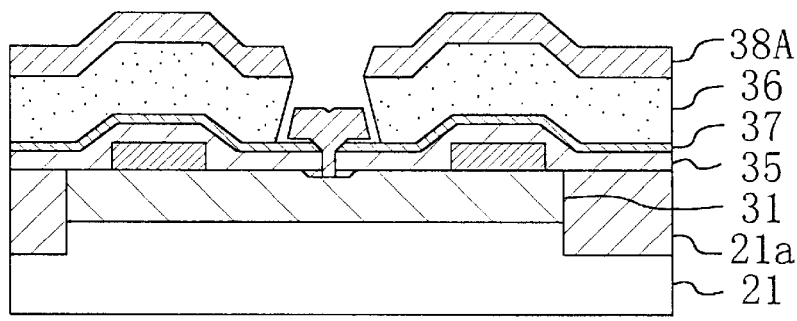
Figure 4D:
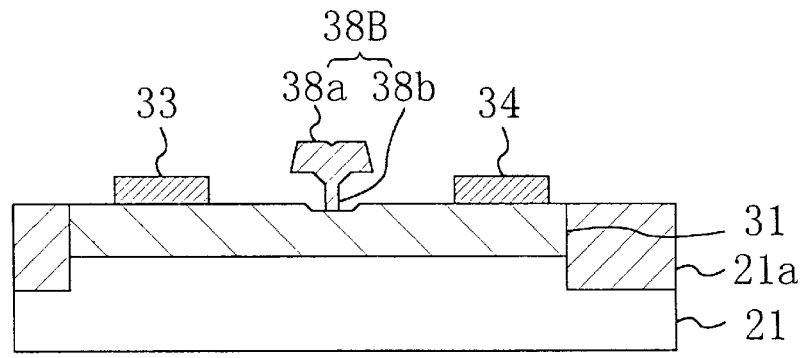

Subsequently, as shown in FIG. 4(b), the cap layer in the epitaxial multilayer 31 is subjected to recess etching, thereby forming a recessed portion 31a exposing the Schottky layer. Next, as shown in FIG. 4(c), metal films 38A for forming a gate electrode, consisting of Ti/Pt/Au films (50 nm/50 nm/400 nm), are sequentially evaporated and deposited over the entire surface of the substrate 21 by an EB evaporation method. Thereafter, as shown in FIG. 4(d), the lower resist film 35 and the upper resist film 36 are lifted off. As a result, a T-gate electrode 38B, including the head portion 38a and the leg portion 38b extending downward from the head portion 38a, is made out of the metal films 38A.

As can be understood, in the method for fabricating a semiconductor device in this embodiment, the lower resist film 35 for forming the leg-forming region 35a of the T-gate electrode 38B is made of PMMA to be exposed to EB. On the other hand, the upper resist film 36 for forming the head-forming region 36a of the T-gate electrode 38B is made of TLOR mainly composed of PGMEA to be exposed to i-rays. Thus, in the lower part of the upper resist film 36 in contact with the lower resist film 35, the mixed layer 37 is formed as a result of the mixture of the upper and lower resist films 36, 35. If the lower-layer opening 35b to be the leg-forming region 35a is provided by exposing the mixed layer 37 and the lower resist film 35 to EB, then the opening formed in the mixed layer 37 is shaped like a taper progressively expanding upward. Thus, if the T-gate electrode 38B is formed using the lower-layer opening 35b of such a shape, then the leg portion 38b of the T-gate electrode 38B can have an upper part connected to the head portion 38a and shaped like a taper having a diameter gradually increasing upward with more ease and more certainty. Accordingly, the head portion 38a and the leg portion 38b can be connected more satisfactorily to each other mechanically and electrically. As a result, reduction of the gate resistance and shortening of the gate length are realized simultaneously without decreasing the throughput.

In addition, since TLOR is a negative type resist, the non-exposed, head-forming region 36a is shaped like an inverse taper progressively shrinking upward and an overhang state is more likely to be established as shown in FIG. 3(c). Thus, during the evaporation of the metal films 38A for forming a gate electrode as shown in FIG. 4(c), the connection portions between the part of the metal films 38A deposited on the bottom of the upper-layer opening 36b and the parts deposited on the upper resist film 36 has a small thickness. Accordingly, the connection portions of the metal films 38A can be cut off easily, and therefore, it is possible to eliminate the generation of burrs, which are generally often formed at side ends of the head portion 38a during lifting off.

EMBODIMENT 2

Hereinafter, the second embodiment of the present invention will be described with reference to the drawings.

FIG. 5(a) through FIG. 7(d) illustrate cross-sectional structures corresponding to the respective process steps for forming a T-gate electrode in a method for fabricating a semiconductor device in the second embodiment. In this embodiment, the same substrate 21 with an epitaxial multilayer 31 formed on the principal surface thereof as that of the first embodiment shown in FIG. 2(a) is also used. Thus, the same components as those used in the first embodiment will be identified by the same reference numerals.

Figure 5A:
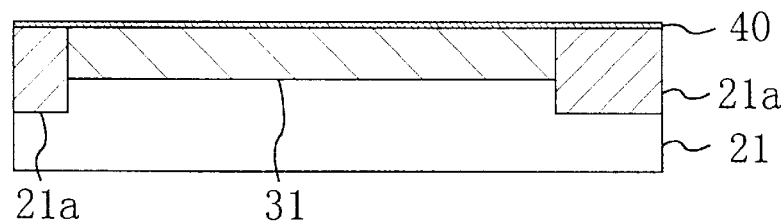
FIGS. 5(a) through 5(d) are cross-sectional views sequentially illustrating the process steps for fabricating a semiconductor device in the second embodiment of the present invention.

First, as shown in FIG. 5(a), boron or oxygen ions are implanted into element isolation regions 21a in the substrate 21, thereby isolating respective elements. In this process step, the elements may be isolated from each other by removing the element isolation regions 21a through mesa etching. Thereafter, a protective insulating film 40, which is made of $SiO_2$, SiN or the like and has a thickness of about 30 nm, is deposited thereon as an adhesion layer. The thickness of the protective insulating film 40 forms a part of the height of the leg portion of the T-gate electrode. Thus, the thinner the film 40 is, the better.

Figure 5B:
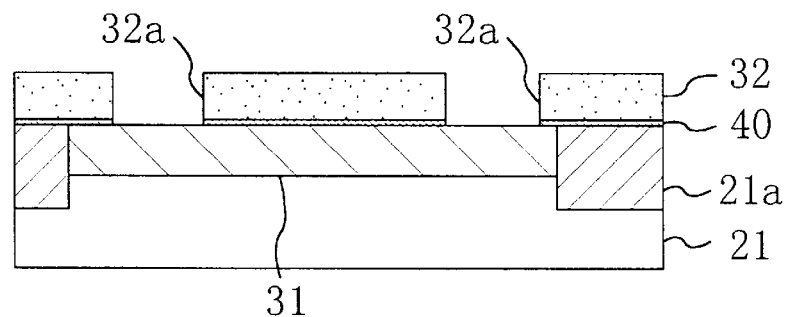
Figure 5C:
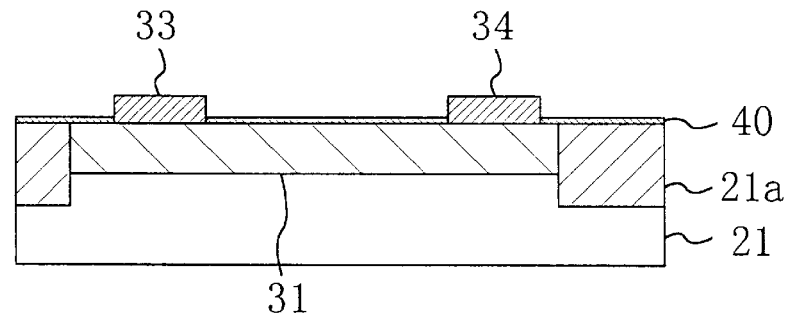

Next, as shown in FIG. 5(b), a resist pattern 32 having openings 32a in the source/drain forming regions is formed over the epitaxial multilayer 31. Then, a metal film containing Au is deposited over the entire surface of the substrate 21. Then, the resist pattern 32 is lifted off, thereby making source/drain electrodes 33, 34 out of the metal film on the epitaxial multilayer 31 over the substrate 21 so as to be spaced from each other.

Figure 5D:
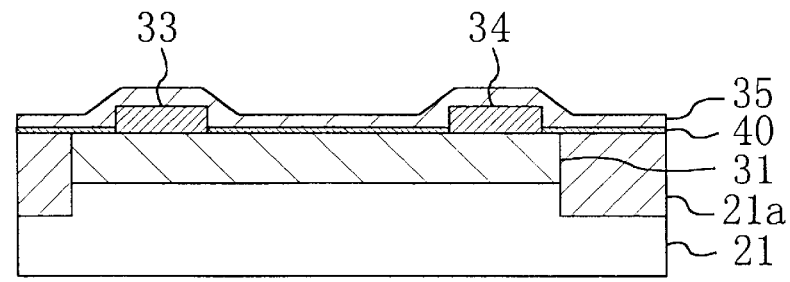

Then, as shown in FIG. 5(d), a lower resist film 35, made of PMMA and to be exposed to EB, is applied onto the entire surface of the substrate 21 and is baked in a predetermined manner. The thickness of the lower resist film 35, as well as the thickness of the protective insulating film 40, regulates the height of the leg portion of the T-gate electrode, and considerably affects the operating characteristics of the transistor in the high frequency regions. This is because if the height of the leg portion is increased, the parasitic capacitance among the gate electrode, the substrate and the ohmic electrode is decreased. However, if the lower resist film 35 is too thick, then the aspect ratio of the height to the gate length becomes too large. In such a case, since the leg and head portions of the T-gate electrode cannot be satisfactorily connected to each other, the gate resistance increases. Thus, in this embodiment, the thickness of the lower resist film 35 is set in the range from about 200 nm to about 250 nm.

Figure 6A:
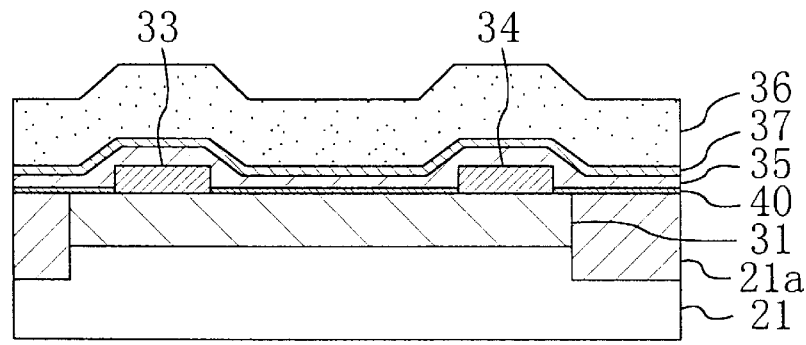
FIGS. 6(a) through 6(d) are cross-sectional views illustrating the subsequent process steps for fabricating the semiconductor device of the second embodiment.

Subsequently, as shown in FIG. 6(a), an upper resist film 36 to be exposed to i-rays is applied onto the entire surface of the substrate 21. In this embodiment, the upper resist film 36 is made of a negative type resist TLOR mainly composed of propyleneglycolmonomethylether acetate (PGMEA). The thickness of the upper resist film 36 regulates the height of the head portion of the T-gate electrode. In general, in order to reduce gate resistance, a metal film for forming a gate electrode should have a thickness of 500 nm or more. Thus, in this embodiment, the thickness of the upper resist film 36 is set in the range from about 0.5 $\mu$m to about 1.5 $\mu$m. Thereafter, a mixed layer 37 is formed in the lower part of the upper resist film 36 in contact with the lower resist film 35 as a result of the mixture of the upper and lower resist films 36, 35.

Figure 6B:
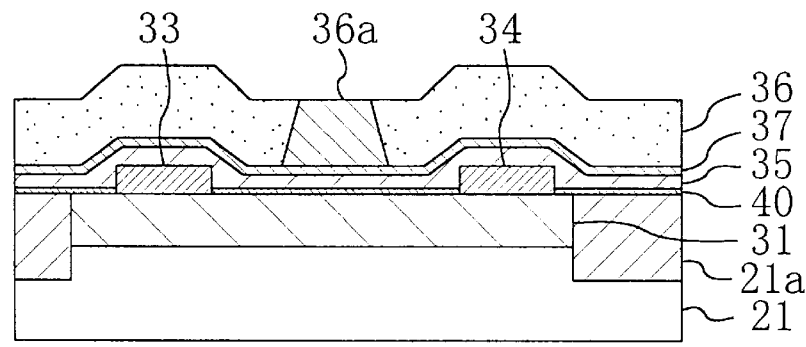

Next, as shown in FIG. 6(b), the upper resist film 36 is pre-baked in a predetermined manner. Then, the upper resist film 36, except for the head-forming region 36a of the T-gate electrode, is exposed to i-rays by using a stepper. Subsequently, post exposure baking is performed, thereby developing the upper resist film 36 with a TMAH solution, which is a developer for the upper resist film 36. In this case, he lower resist film 35 and the mixed layer 37 are not disolved by the TMAH solution.

Figure 6C:
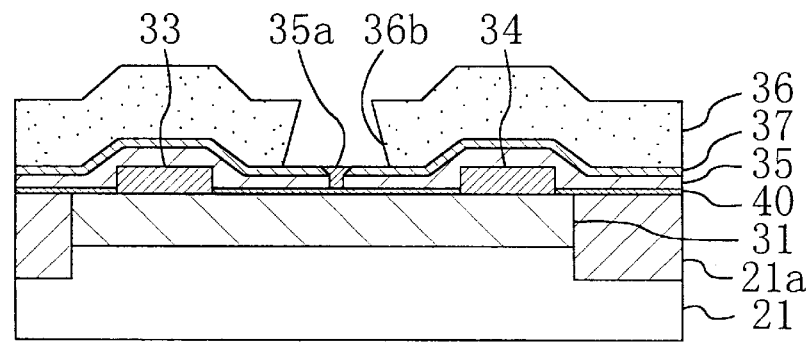

Consequently, as shown in FIG. 6(c), a part of the upper resist film 36 corresponding to the head-forming region 36a is removed to form an upper-layer opening 36b. Then, the upper resist film 36 is baked to make the upper resist film 36 hard to dissolve in the mixture of MIBK and IPA as a developer for the lower resist film 35. Thereafter, a T-gate-electrode-leg-forming region 35a of the mixed layer 37 and the lower resist film 35 is exposed to EB by using an EB exposure system.

Figure 6D:
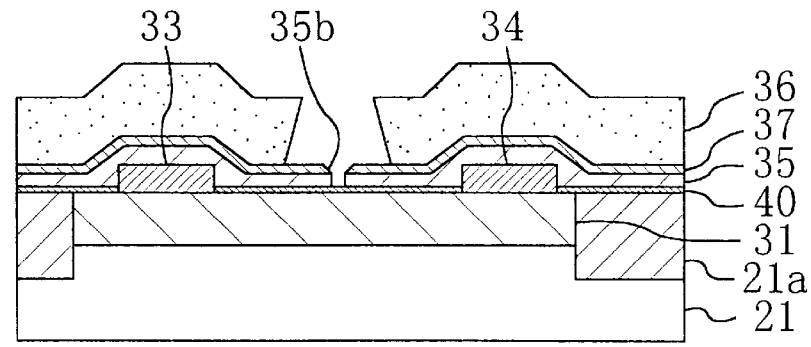

Next, as shown in FIG. 6(d), the lower resist film 35 is developed with a mixture of MIBK and IPA, thereby removing the part of the lower resist film 35 corresponding to the leg-forming region 35a to form a lower-layer opening 35b. In general, a lower resist film is developed to form an inverse taper progressively expanding downward. By contrast, in this embodiment, the mixed layer 37 is formed in the interface between the lower and upper resist films 35, 36. Thus, the lower resist film 35 is developed to form a lower-layer opening 35b with the upper part in the mixed layer 37 shaped like a taper progressively expanding upward. As a result, the upper part of the leg portion of the T-gate electrode, which is connected to the head portion, is formed like a taper having a cross-sectional area gradually increasing upward.

Thereafter, the lower-layer opening 35b of the lower resist film 35 is dry-etched with $O_2$ plasma, thereby removing resist residues (presumably those of the mixed layer 37). As a result, since the recess etching can be performed more accurately in the next step, it is possible to prevent the Schottky contact from being deteriorated.

Figure 7A:
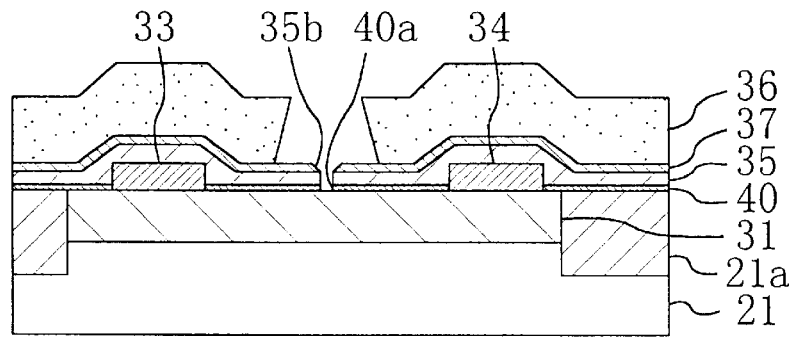
FIGS. 7(a) through 7(d) are cross-sectional views illustrating the remaining process steps for fabricating the semiconductor device of the second embodiment.

Subsequently, as shown in FIG. 7(a), the protective insulating film 40 is dry-etched using a gas such as $CF_4$ and the lower-layer opening 35b of the lower resist film 35 as a mask, thereby forming an opening 40a as a part of the leg-forming region of the T-gate electrode. In this case, the lower resist film 35 made of PMMA is less resistant to dry etching than a positive type resist generally used. Thus, the pattern size possibly expands or the head portion of the T-gate electrode possibly comes closer to the surface of the substrate as a result of the decrease in thickness of the lower resist film 35. Accordingly, the conditions for dry etching should be sufficiently optimized.

Figure 7B:
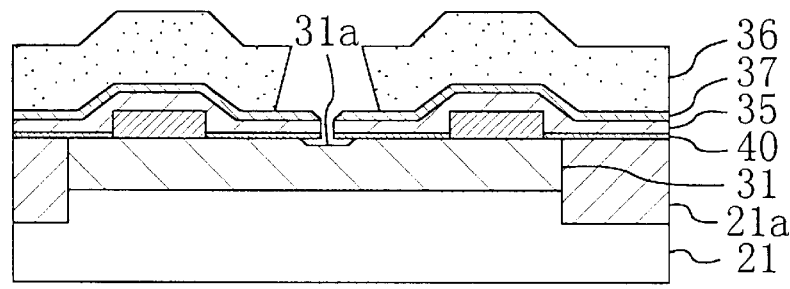
Figure 7C:
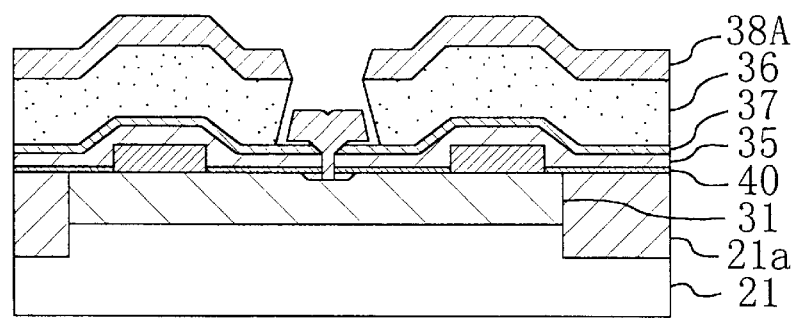
Figure 7D:
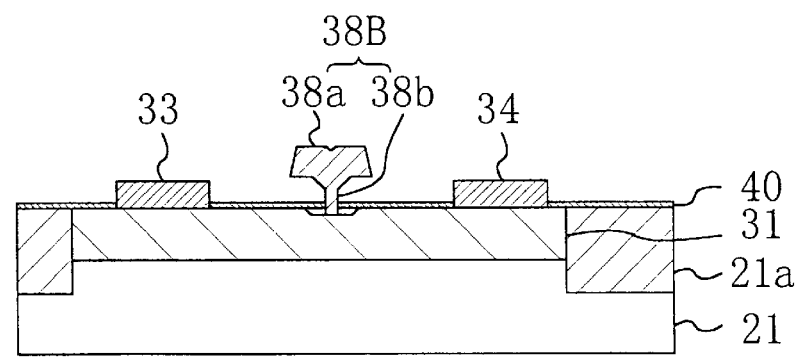
Figure 8A:
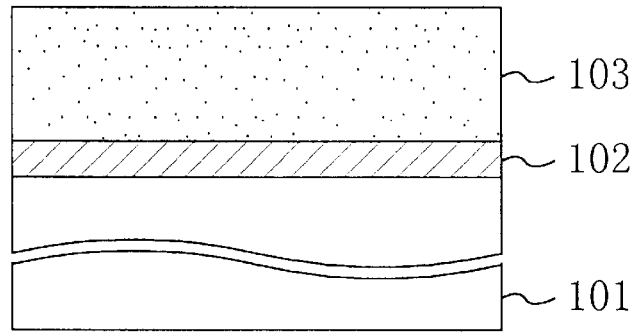
FIGS. 8(a) through 8(d) are cross-sectional views sequentially illustrating the process steps for forming a T-gate electrode in a method for fabricating a semiconductor device in the first prior art example.
Figure 8B:
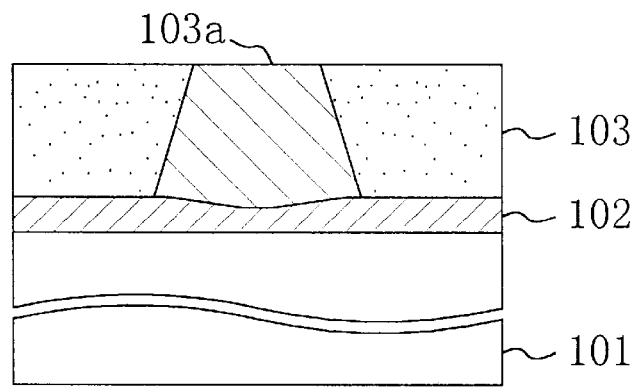
Figure 8C:
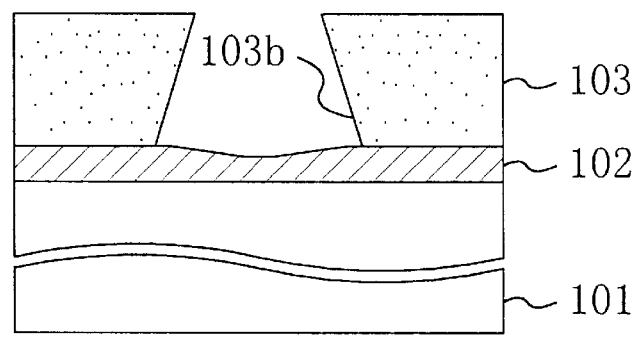
Figure 8D:
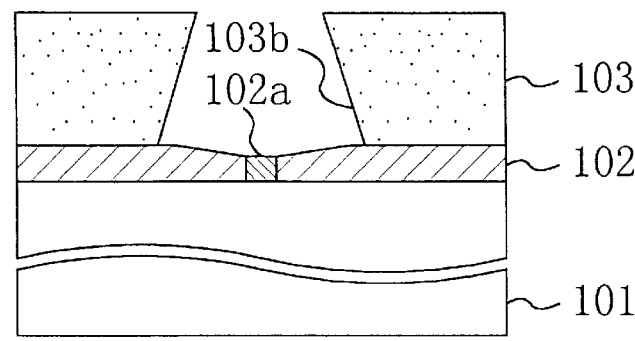
Figure 9A:
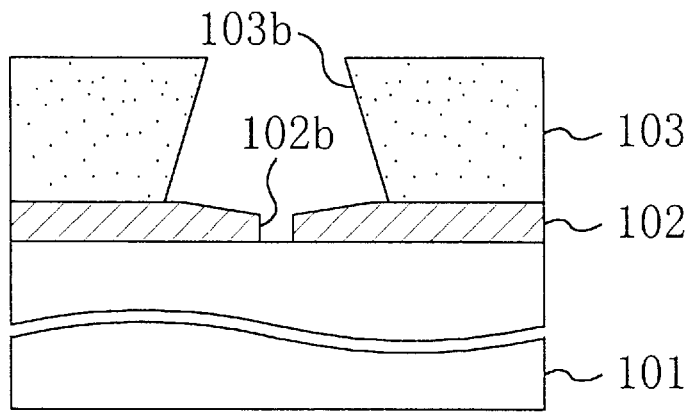
FIGS. 9(a) through 9(c) are cross-sectional views illustrating the remaining process steps for forming the T-gate electrode in the first prior art example.
Figure 9B:
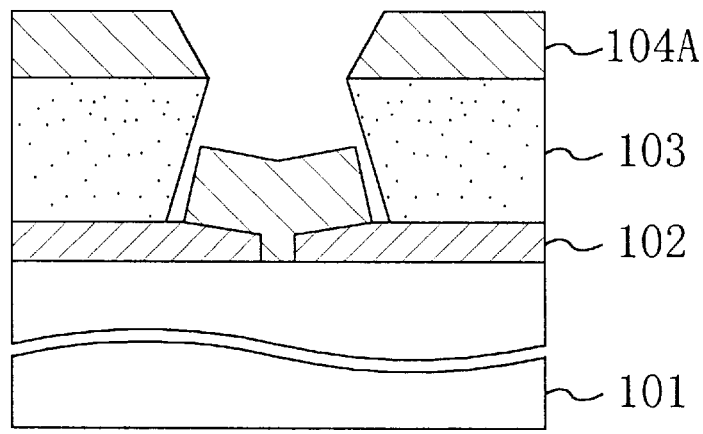
Figure 9C:
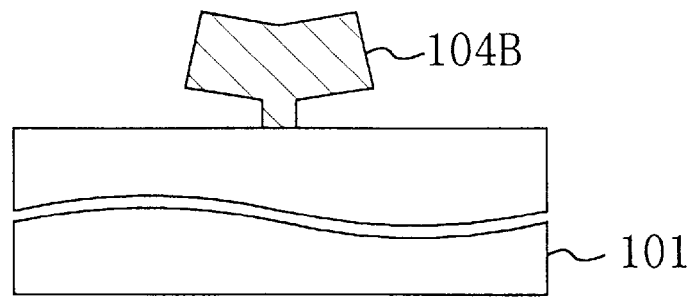
Figure 10A:
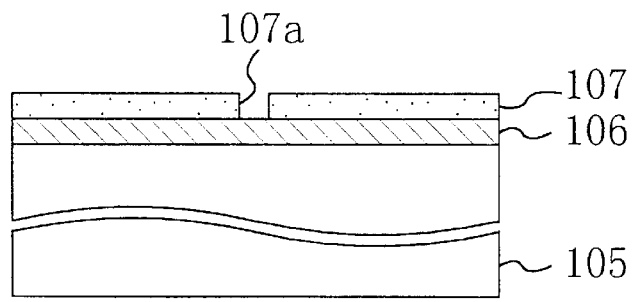
FIGS. 10(a) through 10(d) are cross-sectional views sequentially illustrating the process steps for forming a T-gate electrode in a method for fabricating a semiconductor device in the second prior art example.
Figure 10B:
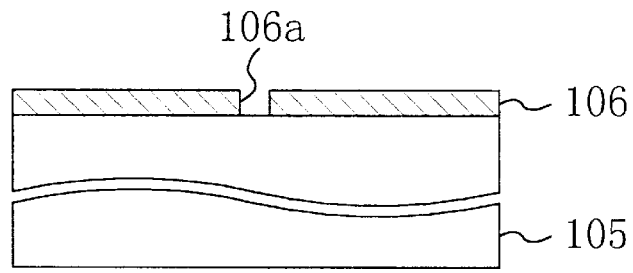
Figure 10C:
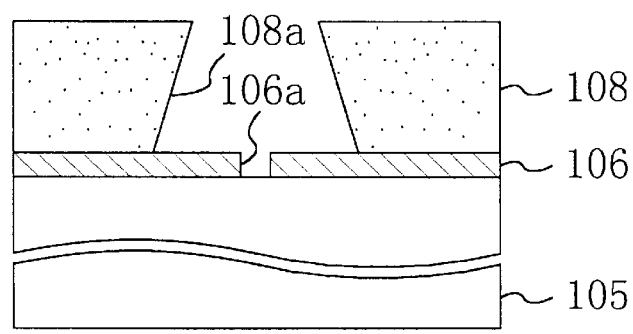
Figure 10D:
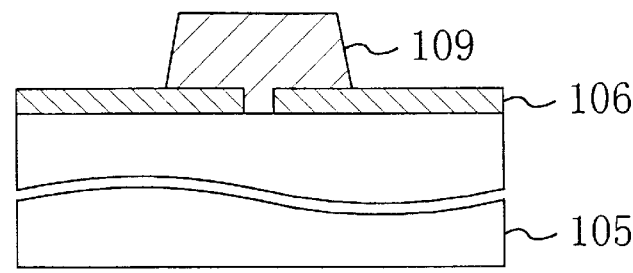

Then, as shown in FIG. 7(b), recess etching is performed on the cap layer in the epitaxial multilayer 31 through wet etching, thereby forming a recessed portion 31a exposing the Schottky layer. Next, as shown in FIG. 7(c), metal films 38A for forming a gate electrode, consisting of Ti/Pt/Au films (50 nm/50 nm/400 nm), are sequentially evaporated and deposited over the entire surface of the substrate 21 by an EB evaporation method. Thereafter, as shown in FIG. 7(d), the lower and upper resist films 35, 36 are lifted off. As a result, a T-gate electrode 38B, including the head portion 38a and the leg portion 38b extending downward from the head portion 38a, is made out of the metal films 38A.

In the method of this embodiment, the lower resist film 35 is made of PMMA to be exposed to EB, and the upper resist film 36 is made of TLOR mainly composed of PGMEA to be exposed to i-rays in the same way as the first embodiment. Thus, in the lower part of the upper resist film 36 in contact with the lower resist film 35, the mixed layer 37 is formed as a result of the mixture of the upper and lower resist films 36, 35. Accordingly, if the lower-layer opening 35b to be the leg-forming region 35a is provided by exposing the mixed layer 37 and the lower resist film 35 (for forming the leg-forming-region 35a of the T-gate electrode 38B) to EB, then an opening formed in the mixed layer 37 is shaped like a taper progressively expanding upward. Thus, if the T-gate electrode 38B is formed by using the lower-layer opening 35b of such a shape, then the leg portion 38b of the T-gate electrode 38B can have an upper part connected to the head portion 38a and shaped like a taper having a diameter gradually increasing upward with more ease and more certainty. Accordingly, since the head portion 38a and the leg portion 38b can be more satisfactorily connected to each other mechanically and electrically, reduction of the gate resistance and shortening of the gate length are simultaneously realized without decreasing the throughput.

Furthermore, a lower resist film made of PMMA is generally less adhesive to a semiconductor substrate as compared with a positive type resist to be exposed to i-rays. Such poor adhesion is negligible during the formation of a recessed portion through dry etching. However, in the case of forming a recessed portion through wet etching, the recess etchant possibly permeates the region between the source electrode 33 and the substrate or between the drain electrode 34 and the substrate and thereby deteriorates the electrical characteristics.

Thus, if the protective insulating film 40, made of $SiO_2$, SiN or the like, is formed on the upper surface of the epitaxial multilayer 31 on the semiconductor substrate 21 as in this embodiment, then the adhesion of the lower resist film 35 to the substrate can be improved. Accordingly, even if a recessed portion is formed through wet etching (which is simpler and more controllable than dry etching), the characteristics of the FET are not adversely affected.

What is claimed is:

1. A method for fabricating a semiconductor device including a T-gate electrode, the T-gate electrode being formed over a semiconductor substrate and having a head portion and a leg portion extending downward from the head portion, the method comprising the steps of:

a) applying a lower resist film on the semiconductor substrate, the lower resist film being sensitive to electron beams;

b) applying an upper resist film on the lower resist film, the upper resist film being sensitive to ultraviolet rays;

c) patterning a region of the upper resist film, in which region the head portion is to be formed, by irradiating the upper resist film with ultraviolet rays, and then forming an upper-layer opening in the head-forming region of the upper resist film by developing the upper resist film patterned;

d) patterning a region of the lower resist film, in which region the leg portion is to be formed, by irradiating an upper surface region of the lower resist film with electron beams, the upper surface region being exposed inside the upper-layer opening, and then forming a lower-layer opening in the leg-forming region of the lower resist film by developing the lower resist film patterned, an upper part of the lower-layer opening being connected to the head-forming region and having a diameter gradually increasing toward the head-forming region; and e) forming a T-gate electrode of a conductor film by filling in the lower and upper-layer openings with the conductor film over the semiconductor substrate,
   wherein step c) comprises the step of forming a mixed layer in an interface between the lower and upper resist films, the mixed layer being formed through the mixture of the lower and upper resist films.

2. The method of claim 1, wherein the upper resist film is made of a chemically amplified resist.

3. The method of claim 1, wherein the lower resist film is made of a resist containing polymethyl methacrylate, and wherein the upper resist film is made of a resist containing propyleneglycolmonomethylether acetate.

4. The method of claim 1, further comprising the step of baking the upper resist film between the steps c) and d).

5. The method of claim 1, wherein the step d) comprises the step of removing residues of the lower and upper resist films by dry-etching the lower and upper resist films.

6. The method of claim 1, wherein the step a) comprises the step of depositing an adhesion layer, made of an insulating material, over the semiconductor substrate prior to the application of the lower resist film.

* * * * *